(12) United States Patent
Baloglu et al.

(10) Patent No.: US 9,741,617 B2
(45) Date of Patent: Aug. 22, 2017

(54) ENCAPSULATED SEMICONDUCTOR PACKAGE AND METHOD OF MANUFACTURING THEREOF

(71) Applicant: Amkor Technology, Inc., Tempe, AZ (US)

(72) Inventors: Bora Baloglu, Chandler, AZ (US); Curtis Zwenger, Chandler, AZ (US); Ron Huemoeller, Gilbert, AZ (US)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 14/942,863

(22) Filed: Nov. 16, 2015

(65) Prior Publication Data
US 2017/0140988 A1    May 18, 2017

(51) Int. Cl.
| | | |
|---|---|---|
| *H01L 21/00* | (2006.01) | |
| *H01L 21/78* | (2006.01) | |
| *H01L 21/56* | (2006.01) | |
| *H01L 23/29* | (2006.01) | |
| *H01L 23/31* | (2006.01) | |
| *H01L 21/683* | (2006.01) | |

(52) U.S. Cl.
CPC .............. *H01L 21/78* (2013.01); *H01L 21/56* (2013.01); *H01L 21/566* (2013.01); *H01L 21/6836* (2013.01); *H01L 23/29* (2013.01); *H01L 23/3185* (2013.01); *H01L 2221/68327* (2013.01); *H01L 2924/181* (2013.01)

(58) Field of Classification Search
CPC .......... H01L 2924/181; H01L 21/6836; H01L 2221/68327; H01L 21/56
See application file for complete search history.

(56) References Cited

U.S. PATENT DOCUMENTS

| | | | |
|---|---|---|---|
| 7,064,010 B2* | 6/2006 | Farnworth | H01L 21/78 257/E21.502 |
| 9,324,686 B2* | 4/2016 | Nam | H01L 23/562 |
| 2004/0155290 A1* | 8/2004 | Mech | H01L 21/76251 257/347 |
| 2008/0197455 A1* | 8/2008 | Fukuda | H01L 21/561 257/620 |
| 2009/0179207 A1* | 7/2009 | Chitnis | H01L 33/44 257/88 |
| 2011/0221053 A1* | 9/2011 | Chandrasekaran | H01L 21/561 257/686 |
| 2012/0181640 A1* | 7/2012 | von Koblinski | H01L 21/84 257/421 |
| 2012/0209100 A1* | 8/2012 | De Beeck | H01L 23/3114 600/377 |
| 2012/0329246 A1* | 12/2012 | Finn | H01L 21/67207 438/462 |
| 2013/0234193 A1* | 9/2013 | Odnoblyudov | H01L 33/0095 257/99 |
| 2013/0320551 A1* | 12/2013 | Boettcher | H01L 24/11 257/773 |

(Continued)

*Primary Examiner* — Ngan Ngo
(74) *Attorney, Agent, or Firm* — McAndrews, Held & Malloy, Ltd.

(57) ABSTRACT

Encapsulated semiconductor packages and methods of production thereof. As a non-limiting example, a semiconductor package may be produced by partially dicing a wafer, molding the partially diced wafer, and completely dicing the molded and partially diced wafer.

20 Claims, 3 Drawing Sheets

(56) References Cited

U.S. PATENT DOCUMENTS

| | | | |
|---|---|---|---|
| 2013/0341803 A1* | 12/2013 | Cheah | H01L 24/05 257/774 |
| 2015/0091183 A1* | 4/2015 | Fischer | H01L 21/76877 257/774 |
| 2015/0137341 A1* | 5/2015 | Liu | H01L 27/14636 257/692 |
| 2016/0247849 A1* | 8/2016 | Oganesian | H01L 27/14643 |
| 2016/0293488 A1* | 10/2016 | Grivna | H01L 21/78 |

* cited by examiner

ENCAPSULATED SEMICONDUCTOR PACKAGE AND METHOD OF MANUFACTURING THEREOF

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND

Various semiconductor packages, for example semiconductor packages encapsulated in molding compound, are unnecessarily costly to produce and subject to manufacturing defects during the encapsulation process. Limitations and disadvantages of conventional encapsulated semiconductor packages, and methods for production thereof, will become apparent to one of skill in the art, through comparison of such approaches with some aspects of the present methods and systems set forth in the remainder of this disclosure with reference to the drawings.

SUMMARY

Figure 1:
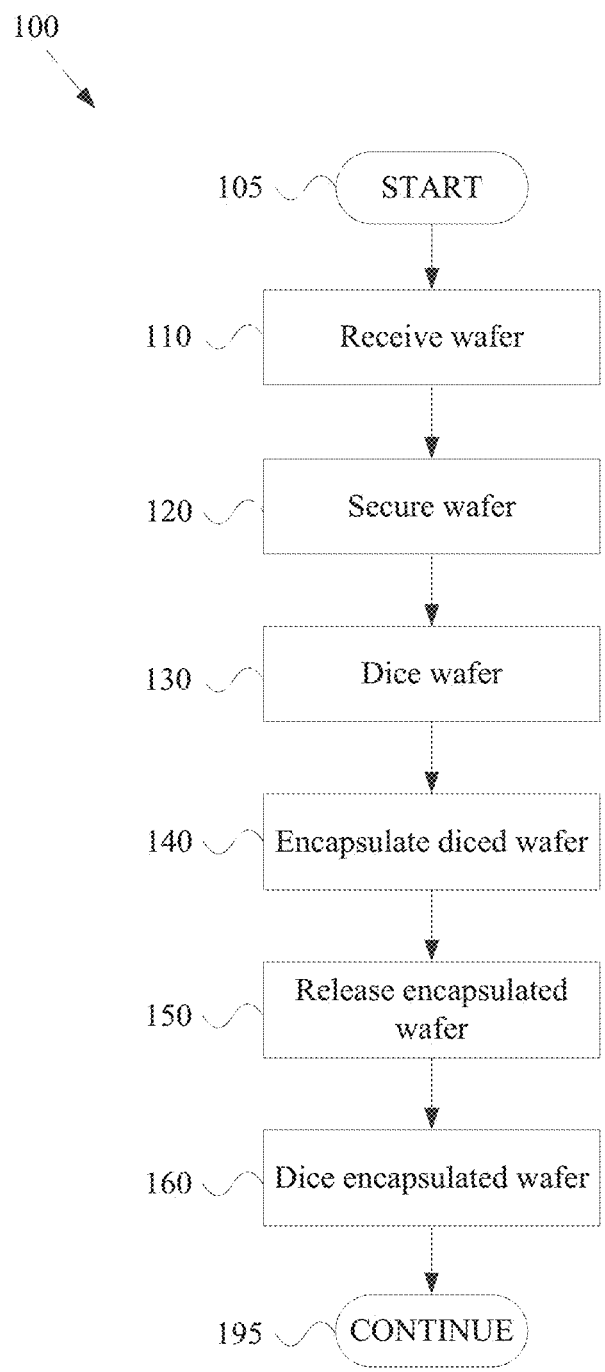
FIG. 1 shows a flow diagram of an example method of manufacturing a semiconductor package, in accordance with various aspects of the present disclosure.

Various aspects of this disclosure provide encapsulated semiconductor packages and methods of production thereof. As a non-limiting example, a semiconductor package may be produced by partially dicing a wafer, molding the partially diced wafer, and completely dicing the molded and partially diced wafer.

DETAILED DESCRIPTION OF VARIOUS ASPECTS OF THE DISCLOSURE

As utilized herein, "and/or" means any one or more of the items in the list joined by "and/or". As an example, "x and/or y" means any element of the three-element set {(x), (y), (x, y)}. That is, "x and/or y" means "one or both of x and y." As another example, "x, y, and/or z" means any element of the seven-element set {(x), (y), (z), (x, y), (x, z), (y, z), (x, y, z)}. That is, "x, y, and/or x" means "one or more of x, y, and z." As utilized herein, the terms "e.g.," and "for example" set off lists of one or more non-limiting examples, instances, or illustrations.

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," "top," "bottom," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

In an example method of producing a molded semiconductor package, a wafer is fully diced. Then the separate dies are individually picked and placed on a carrier. While the dies are being held in place on the carrier, the dies are molded. The molded dies are then singulated again to form individual packages. Such a process includes various opportunities for improvement. For example, the die picking and placing process is inefficient and costly. Additionally, during molding the individual dies may shift on the carrier, resulting in defective packages. Various aspects of the present disclosure provide molded semiconductor packages and methods for producing thereof, which result in lower production cost, faster production time, and a lower number of defective packages.

FIG. 1 shows a flow diagram of an example method 100 of manufacturing a semiconductor package, in accordance with various aspects of the present disclosure. The example package may for example comprise a wafer level chip scale package, but the scope of this disclosure is not limited thereto.

The example method 100 may begin execution at block 105. The example method 100 may begin executing in response to any of a variety of causes or conditions, non-limiting examples of which are provided herein. For example, the example method 100 may begin executing in response to an upstream process indicating that a wafer of semiconductor die is ready to be packaged and/or on its way to a station implementing the method 100 or a portion thereof. Additionally, for example, the example method 100 may begin executing in response to execution flow of the method 100 returning to block 105 from another block of the method 100. In general, the example method 100 may begin executing in response to any of a variety of causes or conditions. Accordingly, the scope of the present disclosure should not be limited by characteristics of any particular causes or conditions.

The example method 100 may, at block 110, comprise receiving a wafer of semiconductor dies. Block 110 may comprise receiving the wafer in any of a variety of manners, non-limiting examples of which are provided herein. For example, block 110 may comprise receiving a wafer from an operator. Also for example, block 110 may comprise receiving the wafer from an automated handling system (e.g., without direct operator interaction). Additionally, for example, block 110 may comprise receiving the raw wafer as a separate part, on a traveling or transfer fixture, etc. In general, block 110 may comprise receiving a wafer of semiconductor dies. Accordingly, the scope of the present disclosure should not be limited by characteristics of any particular manner of receiving such a wafer.

Though this disclosure generally refers to a wafer of semiconductor dies (e.g., a silicon wafer, etc.), the scope of various aspects of this disclosure is not limited thereto. For example, the semiconductor dies may be received as a panel, a portion of a wafer, etc. Also, the received wafer may comprise any of a variety of features, for example added to the wafer in a back-end wafer fabrication process, added by a previous semiconductor device packaging process, etc. For example, the wafer may comprise just bare die, the wafer may comprise various dielectric layers and/or conductive layers (e.g., redistribution layers) formed thereon (e.g., on an active side of the wafer), the received wafer may have interconnection features (e.g., pads, lands, bumps, etc.) formed thereon (e.g., on an active side of the wafer), the received wafer may comprise through-silicon-vias formed therein, etc. Accordingly, the scope of this disclosure should not be limited by particular characteristics of a received wafer or panel of semiconductor die.

The example method 100 may, at block 120, comprise securing the received wafer (e.g., the wafer received at block 110). Block 120 may comprise securing the received wafer in any of a variety of manners, non-limiting examples of which are provided herein. For example, block 120 may comprise adhering the received wafer to a tape (e.g., a thermal release tape, an ultraviolet release tape, etc.) that is disposed on a carrier. For example, an active side of the received wafer may be placed in contact with a release tape. Also for example, block 120 may comprise adhering the received wafer to an adhesive paste or liquid, for example coated on or to be placed on a carrier. Note that adhesive curing may be performed if necessary. Additionally for example, block 120 may comprise utilizing a vacuum and/or mechanical mechanism to secure the wafer, etc.

A carrier to which the wafer is secured may comprise any of a variety of characteristics. For example, the carrier may comprise a metal carrier, a glass carrier, a ceramic carrier, etc. The carrier may, for example, comprise features that mate with corresponding features of fixtures or apparatus utilized in subsequent dicing, molding, or general package-forming operations.

Figure 2B:
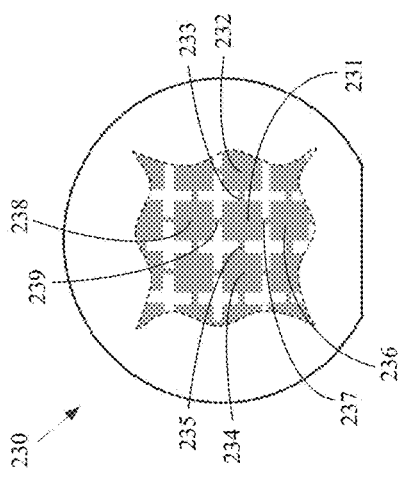
FIGS. 2A-2D show diagrams illustrating various aspects of the example method of FIG. 1, in accordance with various aspects of the present disclosure.
Figure 2D:
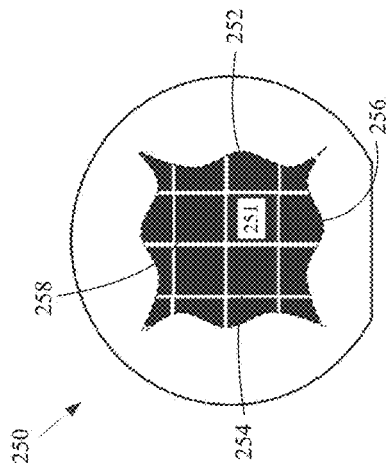
Figure 2A:
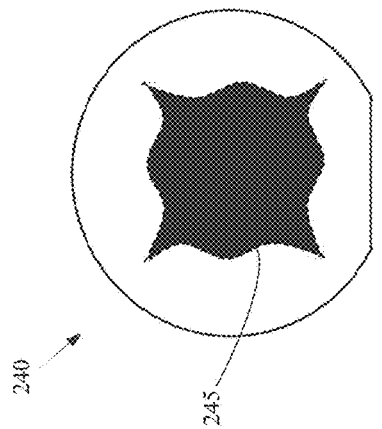

An example illustration 220 of block 120 is shown at FIG. 2A. For example, the active side of the wafer 224 is placed on a layer of adhesive 222 (e.g., a thermal release tape, etc.). In general, the wafer 224 will cover the adhesive 222, which is revealed in FIG. 2A for illustrative purposes.

In general, block 120 may comprise securing the received wafer in any of a variety of manners. Accordingly, the scope of the present disclosure should not be limited by characteristics of any particular manner of and/or mechanism for securing a wafer.

The example method 100 may, at block 130, comprise dicing the secured wafer (e.g., as secured at block 120). Block 130 may comprise dicing the wafer in any of a variety of manners, non-limiting examples of which are provided herein.

For example, block 130 may comprise only partially dicing (or singulating) the wafer. In an example implementation, block 130 may comprise cutting or etching completely through the wafer along first portions of singulation streets, and refraining from cutting or etching completely through (or from any cutting or etching) the wafer along second portions of the singulation streets. FIG. 2B provides an example illustration 230 of a partially diced wafer resulting from block 130.

The illustration 230 shows a first die 231 of the wafer connected to a second die 232 with a second connector 233 (or connecting member). Such a connector 233 may, for example, correspond to a non-cut (or non-completely-cut, or non-etched, or non-completely-etched, etc.) portion of a singulation street. The second connector 233 may, for example, comprise a height (or thickness) that is the same as the first die 231 or may be shorter. Also for example, the connector 233 may have any of a variety of length characteristics. For example, in an example implementation, the connector 233 may be 140 um long (e.g., +/−5% or +/−10%) or less between the first die 231 and the second die 232. In other words, the width of the cut (or etched) portion of the singulation street may be 140 um wide (e.g., +/−5% or +/−10%) or less. The connector 233 may also, for example, have any of a variety of width characteristics. For example, the width of the connector 233 may be generally the same as its height. Also for example, the connector 233 may have a width that is less than its height.

Though the connector 233 is generally shown extending from a middle of a side surface of the first die 231 to a middle of a side surface of the second die 232, the connector 233 may be positioned at any of a variety of locations. For example, the connector 233 may be offset from the centers of the dies 231 and 232. Also for example, the connector 233 may be formed at adjacent corners of the dies 231 and 232, etc. Additionally, though only a single example connector 233 is shown between the first die 231 and the second die 232, there may be a plurality of such connectors between the first die 231 and the second die 232 (or between any adjacent die). In another example implementation, there may be connectors connecting diagonal die to each other, for example in addition to or instead of connecting laterally adjacent die.

Similarly, the first die 231 may be connected to a third die 234 with a connector 235, the first die 231 may be connected to a fourth die 236 with a connector 237, and the first die 231 may be connected to a fifth die 238 with a connector 239. Though the example connectors are all shown with same dimensions, the scope of this disclosure is not limited thereto. For example, connectors in row singulation streets may be wider than connectors in column singulation streets. Also for example connectors in singulation streets having relatively fewer die may be wider than connectors in singulation streets having relatively more die (e.g., in a scenario in which a wafer comprises rectangular die, etc.).

Note that although the example implementation discussed herein may comprise connectors, the scope of this disclosure is not limited to only implementations utilizing such connectors. In other words, a full dice may be performed at block 130 instead of a partial dice.

Block 130 may comprise performing the dicing utilizing any of a variety of techniques. For example, block 130 may comprise utilizing etching (e.g., plasma etching, liquid etching, dry etching, etc.) to dice (e.g., partially dice) the wafer. For example, second portions of singulation streets (e.g., corresponding to the connectors discussed herein) may be masked to keep such second portions from being etched, while first portions of the singulation streets may be left unmasked and subject to etching. Note that other wafer etching and/or cutting techniques may be utilized (e.g., laser dicing, mechanical dicing, etc.).

Note that in an example implementation in which the etched wafer is secured to a carrier utilizing an adhesive tape (e.g., a thermal release tape), block 130 may leave the adhesive tape intact while dicing. In another implementation, however, the tape may also be etched or cut (e.g., wholly or partially).

In general, block 130 may comprise dicing the secured wafer (e.g., as secured at block 120) in any of a variety of manners (e.g., partial dicing, etc.). Accordingly, the scope of this disclosure is not limited by any particular manner of dicing.

The example method 100 may, at block 140, comprise encapsulating the wafer (e.g., as diced at block 130) in an encapsulant. Block 140 may comprise performing such encapsulating in any of a variety of manners, non-limiting examples of which are provided herein. For example, block 140 may comprise molding over the diced wafer with a molding compound (e.g., an epoxy molding compound (EMC), etc.). Block 140 may, for example, comprise utilizing a transfer molding process, a compression molding process, an injection molding process, etc.

Figure 2C:
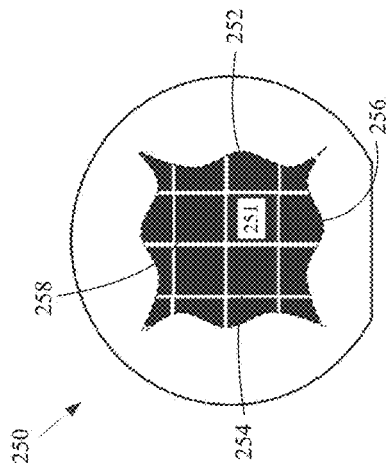

FIG. 2C shows an illustration 240 including the encapsulating material 245 covering the diced wafer of FIG. 2B. The singulation streets, or more particularly the portions of the singulation streets that are free of wafer material after the dicing at block 130, may be filled with the encapsulating material. The encapsulating material may thus surround at least side and top faces of the connectors 233, 235, 237, and 239. The encapsulating material 245 may also cover the surfaces of the dies facing away from the carrier (e.g., the inactive surfaces of the dies in a scenario in which the active surfaces are mounted to the carrier). Such a configuration is shown at FIG. 2C in which no dies and/or connectors therebetween are shown exposed from the encapsulant 245. Note that such die surfaces need not be covered by encapsulant.

In general, block 140 may comprise encapsulating the wafer (e.g., as diced at block 130) in an encapsulant. Accordingly, the scope of this disclosure is not limited by characteristics of any particular type of encapsulating.

The example method 100 may, at block 150, comprise releasing the encapsulated wafer (e.g., encapsulated at block 140) from the carrier. Block 150 may comprise releasing the encapsulated wafer in any of a variety of manners, non-limiting examples of which are provided herein. For example, in an example implementation in which block 120 comprise utilizing thermal release tape to secure the wafer, block 150 may comprise applying heat to the thermal release tape, thereby causing the thermal release tape to lose its adhesion. In other example implementations, block 150 may comprise removing the mechanical and/or vacuum force utilized to secure the wafer at block 120. In yet another example, block 150 may comprise utilizing ultraviolet light and/or chemicals to remove or counteract an adhesive used to secure the wafer at block 120. In general, block 150 may comprise releasing the encapsulated wafer from the carrier.

Accordingly, the scope of this disclosure is not limited by characteristics of any particular manner of performing such releasing.

Note that in various example implementations, block 150 might be skipped. For example, in an example implementation in which a same carrier to which the wafer was secured at block 120 and/or the same wafer orientation may be utilized in subsequent operations (e.g., dicing the encapsulated wafer), the encapsulated wafer may be left secured in such manner.

Also note that in various example implementations (e.g., following the release of the encapsulated wafer from the carrier), various dielectric and conductive layers (e.g., redistribution layers) may be formed, for example, to route signals to desired locations (e.g., on the active surface of the die, on the bottom surface of the encapsulant in a fan-out configuration, etc.).

The example method 100 may, at block 160, comprise dicing the encapsulated wafer. Block 160 may comprise dicing the encapsulated wafer in any of a variety of manners, non-limiting examples of which are provided herein. For example, block 160 may comprise dicing the encapsulated wafer utilizing a laser or mechanical saw (e.g., from a top side of the wafer, from a bottom side of the wafer, etc.).

FIG. 2D provides an example illustration 250 of a diced encapsulated wafer resulting from block 160. Such dicing may, for example, form individual semiconductor device packages. For example, the first semiconductor package 251 may comprise the first semiconductor die 231 shown in FIG. 2B. Similarly, the second semiconductor package 252, third semiconductor package 254, fourth semiconductor package 256, and fifth semiconductor package 258 may comprise the second semiconductor die 232, third semiconductor die 234, fourth semiconductor die 236, and fifth semiconductor die 238, respectively.

As shown graphically when comparing FIG. 2B and FIG. 2D, in an example implementation, a first singulation street having a first width (e.g., as shown in FIG. 2B between die) is formed between the dies at block 130 (e.g., during partial dicing). Such a singulation street may, for example, have connectors remaining therein. Block 160 may then comprise forming a singulation street having a second width (e.g., as shown in FIG. 2D between molded die) that is narrower than the first width. As a result, the side surfaces of the dies remain covered by the encapsulating material 245.

For example, in an example implementation and as discussed herein, block 130 may result in a first singulation street width (e.g., an etched line width, etc.) of 140 um. Continuing the example implementation, block 160 may comprise forming a singulation street having a width (e.g., a cut line width, etc.) of 100 um (e.g., corresponding to a laser beam width, a saw blade width, etc.). In such an implementation, 40 um of molding material 245 may remain, for example a respective 20 um of molding material 245 coupled to a respective side surface of each semiconductor die along the singulation street. Note that such width parameters are examples, and that the scope of this disclosure is not limited thereto. For example, in accordance with various aspects of the present disclosure, a molding compound width of 25 um bordering (e.g., extending from the sides of) each semiconductor die may remain after the dicing at block 160.

The dicing at block 160 may cut through both the molding compound and the connectors extending between and coupling adjacent semiconductor dies. For example, referring to FIGS. 2B and 2C, block 160 may comprise cutting through both the mold compound 245 and the connectors 233, 235, 237, and 239. As with the encapsulating material 245, in an example scenario in which the singulation streets formed at block 160 are wider (e.g., etched line width, etc.) than the singulation streets formed at block 130 (e.g., cut line width, etc.), portions of the connectors 233, 235, 237, and 239 will remain after the dicing, and respective end surfaces of such connectors 233, 235, 237, and 239 may be coplanar with respective cut sides of the encapsulating material 245. Such remaining portions of the connectors 233, 235, 237, and 239 may also be referred to herein as tabs.

In general, block 160 may comprise dicing the encapsulated wafer. Accordingly, the scope of this disclosure should not be limited by characteristics of any particular manner of performing such dicing.

The example method 100 may, at block 195, comprise performing continued processing of the diced packages from the encapsulated wafer. Such continued processing may comprise any of a variety of types of continued processing (e.g., ball dropping, marking, testing, further packaging, signal routing, etc.). Block 195 may also, for example, comprise returning execution flow of the example method 100 to any previous block of the example method 100 (e.g., block 110 for receiving a next wafer and processing such next wafer, etc.).

It should be noted that the example method 100 was presented as an example to illustrate various aspects of the present disclosure. The scope of this disclosure is not limited to the specific characteristics of the example method 100.

Figure 3A:
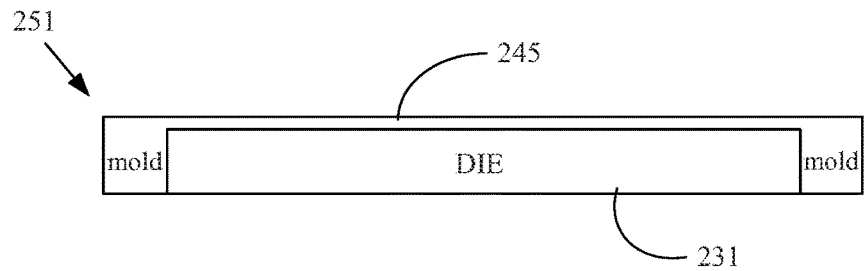
FIGS. 3A-3C show diagrams illustrating side, perspective, and exploded views of an example semiconductor package, in accordance with various aspects of the present disclosure.
Figure 3B:
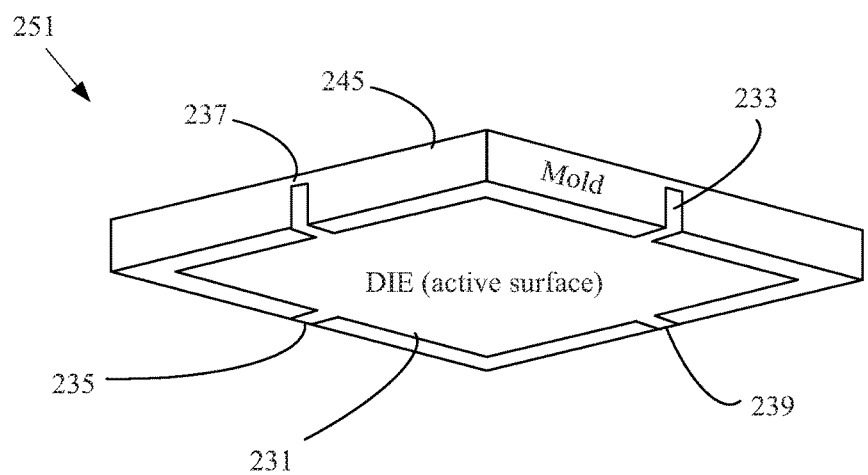
Figure 3C:
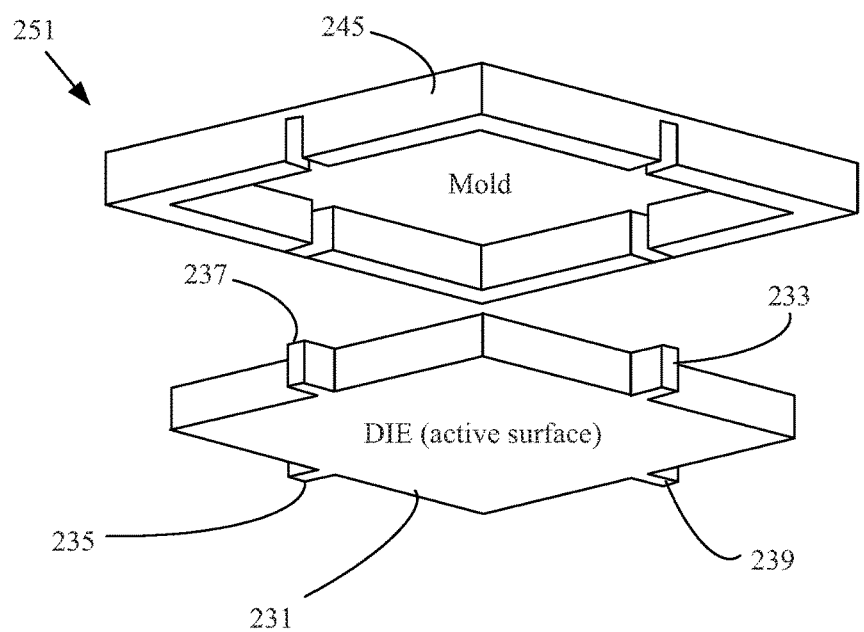

Turning now to FIGS. 3A-3C, such figures show diagrams illustrating side, perspective, and exploded views of an example semiconductor package 251, in accordance with various aspects of the present disclosure. The example semiconductor package 251 may, for example, result from implementing the example method 100 discussed herein. The example semiconductor package 251 (or any portion thereof) may, for example, share characteristics with any other package (or any portion thereof) discussed herein.

FIG. 3A shows a diagram illustrating a cross-sectional view of the example semiconductor package 251 taken across a line that does not intersect one of the tabs from the connectors 233, 235, 237, and 239. In the example semiconductor package 251 the encapsulant 245 (e.g., an epoxy molding compound, etc.) is shown covering a top surface (e.g., an inactive surface, etc.) of the die 231. The encapsulant 245 also covers side surfaces of the die 231. As explained herein, the encapsulant 245 may, for example, extend laterally 20 um from the sides of the die 231. Also for example, the encapsulant 245 may extend laterally 25 um or less from the sides of the die 231. In another example scenario, the encapsulant 245 may extend 100 um or less from the sides of the die 231.

FIG. 3B shows a diagram illustrating a perspective view of the example semiconductor package 251. In the example illustrated, the active surface of the die 231 is exposed from the encapsulant 245 (e.g., from the bottom of the encapsulant). Additionally, various surfaces of tabs (e.g., portions of the connectors 233, 235, 237, and 239 remaining after the dicing at block 160) are exposed from the encapsulant 245. For example, in an implementation in which block 160 comprises cutting both the encapsulant 245 and the connectors 233, 235, 237, and 239 with a same cutting mechanism (e.g., laser, saw blade, directed energy, etching technique, etc.), an end surface of the resulting tabs of the connectors 233, 235, 237, and 239 may be exposed from the sides surfaces of the encapsulant 245 and may be coplanar with the side surfaces of the encapsulant 245. Further, bottom surfaces of such resulting tabs may also be exposed from the encapsulant 245, where such bottom surfaces may for example be coplanar with a bottom surface of the encapsulant 245 and a bottom surface (e.g., active surface, etc.) of the die 231. Still further, top surfaces of such resulting tabs may be covered by the encapsulant 245, along with the top surface of the die 231, which may for example be coplanar with the top surfaces of the tabs.

FIG. 3C shows a diagram of an exploded view of the example semiconductor package 251, for example for a better understanding of the respective shapes of the various components of the example semiconductor package 251. For example, FIG. 3C shows the tabs remaining from the severed connectors 233, 235, 237, and 239, each extending laterally from a respective side surface of the die 231. As discussed herein, the tabs may for example comprise a same height (e.g., thickness) as the die 231. Also for example, the tabs may comprise a length (e.g., distance extending from the sides of the die 231) of 20 um, and in various example implementations of 25 um or less. Additionally for example, the tabs may comprise a length of 100 um or less. Further for example, the tabs may comprise a width dimension that is the same as the height dimension. In other examples, however, as shown in FIGS. 3A-3C, the tabs may comprise a width dimension that is narrower than the height dimension. Though the tabs are generally shown to be identical, note that the tabs may be different from each other. For example, tabs corresponding to a singulation row may comprise dimensions (e.g., width dimensions, etc.) that are different from those of tabs corresponding to a singulation column. For example, tabs corresponding to a singulation street with relatively fewer die may comprise dimensions (e.g., width dimensions, etc.) that are greater (e.g., wider, etc.) than those of tabs corresponding to a singulation street with relatively more die.

In summary, various aspects of this disclosure provide encapsulated semiconductor packages and methods of production thereof. As a non-limiting example, a semiconductor package may be produced by partially dicing a wafer, molding the partially diced wafer, and completely dicing the molded and partially diced wafer. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

The invention claimed is:

1. A method of making a semiconductor device, the method comprising:
   securing a semiconductor wafer to a carrier, the semiconductor wafer comprising a plurality of semiconductor dies;
   while the semiconductor wafer is secured to the carrier, partially dicing the semiconductor wafer;
   encapsulating the partially diced semiconductor wafer; and
   dicing the encapsulated partially diced semiconductor wafer.

2. The method of claim 1, wherein said securing a semiconductor wafer to a carrier comprises attaching the semiconductor wafer to a thermal release tape.

3. The method of claim 1, wherein said partially dicing the semiconductor wafer comprises partially etching the semiconductor wafer.

4. The method of claim 3, wherein said partially etching the semiconductor wafer comprises:
- etching completely through the semiconductor wafer along first portions of a first singulation street; and
- refraining from etching the semiconductor wafer along second portions of the first singulation street.

5. The method of claim 1, wherein said encapsulating the partially diced semiconductor wafer comprises encapsulating the partially diced semiconductor wafer in molding compound.

6. The method of claim 1, wherein said dicing the encapsulated partially diced semiconductor wafer comprises cutting through wafer material of the partially diced semiconductor wafer and through encapsulant.

7. The method of claim 1, wherein said dicing the encapsulated partially diced semiconductor wafer comprises forming a cut line that is narrower than an etch line formed during said partially dicing the semiconductor wafer.

8. The method of claim 1, comprising releasing the encapsulated partially diced semiconductor wafer from the carrier prior to said dicing the encapsulated partially diced semiconductor wafer.

9. A method of making a semiconductor device, the method comprising:
- securing a wafer to a carrier, the wafer comprising a plurality of semiconductor dies;
- partially dicing the secured wafer by, at least in part, etching completely through the secured wafer along first portions of a singulation street and leaving connectors of wafer material extending between and connecting adjacent dies of the plurality of semiconductor dies along second portions of the singulation street;
- encapsulating the partially diced and secured wafer in a molding compound; and
- dicing the encapsulated partially diced wafer by, at least in part, sawing completely through the encapsulated partially diced wafer along the entire singulation street.

10. The method of claim 9, wherein said dicing the encapsulated partially diced wafer comprises forming a cut line along the entirety of the singulation street that is narrower than an etch line formed along the first portions of the singulation street during said partially dicing the secured wafer.

11. The method of claim 9, wherein said encapsulating comprises covering a top surface of each of the plurality of semiconductor dies and a top surface of each of the connectors of wafer material.

12. The method of claim 11, wherein the top surface of each of the plurality of semiconductor dies comprises an inactive surface.

13. The method of claim 9, wherein said dicing the encapsulated partially diced wafer comprises cutting through the connectors and the molding compound.

14. A method of making a semiconductor device, the method comprising:
- securing a semiconductor wafer to a carrier, the semiconductor wafer comprising a plurality of semiconductor dies;
- while the semiconductor wafer is secured to the carrier, partially dicing the semiconductor wafer, leaving at least one tab of semiconductor wafer material that extends from a first die of the plurality of semiconductor dies to a second die of the plurality of semiconductor dies;
- encapsulating the partially diced semiconductor wafer with an encapsulating material; and
- dicing the encapsulated partially diced semiconductor wafer.

15. The method of claim 14, wherein the at least one tab of semiconductor wafer material extends from a middle of a side of the first die to a middle of a side of the second die.

16. The method of claim 14, wherein the first die and the tab have a same thickness.

17. The method of claim 14, wherein said encapsulating comprises covering a top side of the first die, a top side of the second die, and a top side of the at least one tab of semiconductor wafer material with the encapsulating material.

18. The method of claim 17, wherein the top side of the first die is an inactive side.

19. The method of claim 14, wherein said encapsulating comprises covering lateral sides of the at least one tab of semiconductor wafer material with the encapsulating material.

20. The method of claim 14, wherein said dicing the encapsulated partially diced semiconductor wafer comprises cutting through the at least one tab of semiconductor wafer material and the encapsulating material.

* * * * *